United States Patent
Jochym et al.

(10) Patent No.: US 7,040,013 B1
(45) Date of Patent: May 9, 2006

(54) SYSTEM AND METHOD FOR PRINTED CIRCUIT BOARD NET ROUTING

(75) Inventors: Daniel A. Jochym, Downingtown, PA (US); Christian E. Shenberger, Red Lion, PA (US); Robert Fix, Schwenksville, PA (US)

(73) Assignee: Unisys Corporation, Blue Bell, PA (US)

( * ) Notice: Subject to any disclaimer, the term of this patent is extended or adjusted under 35 U.S.C. 154(b) by 377 days.

(21) Appl. No.: 10/390,368

(22) Filed: Mar. 17, 2003

(51) Int. Cl.
*H05K 3/02* (2006.01)

(52) U.S. Cl. ............... 29/846; 29/402.01; 29/825; 29/847; 29/850

(58) Field of Classification Search ............ 29/825, 29/846, 402.01, 848, 847
See application file for complete search history.

(56) References Cited

U.S. PATENT DOCUMENTS

| | | | | |
|---|---|---|---|---|
| 4,831,497 A | * | 5/1989 | Webster et al. | 361/774 |
| 5,470,244 A | * | 11/1995 | Lim et al. | 439/189 |
| 5,696,667 A | * | 12/1997 | Berding | 361/788 |
| 6,710,675 B1 | * | 3/2004 | Mikalauskas | 333/34 |

FOREIGN PATENT DOCUMENTS

| | | | |
|---|---|---|---|
| GB | 2233157 A | * | 1/1991 |
| GB | 2269941 A | * | 2/1994 |
| JP | 02-268484 A | * | 11/1990 |

* cited by examiner

Primary Examiner—Carl J. Arbes
(74) Attorney, Agent, or Firm—Lise A. Rode; Mark T. Starr; RatnerPrestia

(57) ABSTRACT

A method, system, and product for routing nets along a printed circuit board through an obstacle field and a circuit board having traces produced in accordance with the routed nets is disclosed. The nets are routed by identifying a general path for each of a pair of nets between adjacent rows of obstacles within an obstacle field, selectively lengthening at least one of the nets by shifting at least one portion of the net toward a position between adjacent pads in one of the rows, thereby increasing the length of the net, and selectively increasing the mean spacing between the pair of nets by shifting at least one portion of at least one net of the pair away from the other net of the pair toward a position between adjacent pads in one of the rows, thereby reducing cross-talk between the nets.

9 Claims, 6 Drawing Sheets

SYSTEM AND METHOD FOR PRINTED CIRCUIT BOARD NET ROUTING

FIELD OF THE INVENTION

The present invention relates to the field of printed circuit boards and, more particularly, to routing techniques for routing nets through obstacle fields of a printed circuit board.

BACKGROUND OF THE INVENTION

Printed circuit boards (PCBs) are commonly used in electronics to connect electrical/electronic components such as integrated circuits and connectors to one another (referred to herein as components). A typical PCB includes many layers of copper, with each layer of copper separated by a dielectric material. Generally, several of the copper layers are etched to form connection lines (e.g., "traces"). Copper-lined through holes (e.g., "vias") extend though the layers of the PCB to provide connection paths between the layers of the PCB. Commonly, connection pads surround the vias on each layer through which the vias pass to facilitate electrical connection with the vias. If a via is unused on a particular layer, is the pad may be removed, leaving a hole.

Components are typically connected to a PCB using connection pins or a ball grid array (BGA), for example. Such pins of a pin array or balls of a ball grid array act as conductors for the transmission of signals between the components and the PCB. For such components, the PCB has a plurality of vias, pads, or other form of mating conductors corresponding to each conductor of a component. To form a secure electrical connection between a component and vias on a PCB, the conductors of the component are mated with the corresponding conductors on the PCB and soldered. For components with a BGAs, the PCB has a plurality of vias corresponding to each conductor to which the BGA is directly connected or is connected through a pad and a short copper trace on a surface layer of the PCB. To form a secure electrical connection between the component and the PCB, the BGA is soldered to the via or the pad, depending on the configuration.

Connections between components are referred to as "nets." Nets represent the signal path between components and are used to define where the copper traces are positioned within the PCB. Routing nets between components is sometimes challenging because the vias, pads, or other conductors formed on the PCB represent obstacles between which the nets may need to travel. Also, positioning nets too close to one another can give rise to cross-talk. Additionally, some nets may need to be lengthened to optimize performance. The foregoing challenges are more pronounced when dealing with one or more densely populated fields of obstacles such as those associated with connectors, ASICs, and other components. In such densely populated fields, the obstacles may be formed in a patterned grid having closely arranged rows of obstacles.

Accordingly, there is a need for improved methods for routing nets through densely populated obstacle fields. The present invention fulfils this need among others.

SUMMARY OF THE INVENTION

The present invention includes a method, system, and product for routing nets along a printed circuit board through an obstacle field and a circuit board having traces produced in accordance with the routed nets. The nets are routed by identifying a general path for each of a pair of nets between adjacent groups, such as rows, of obstacles within an obstacle field, selectively lengthening at least one of the nets by shifting at least one portion of the net toward a position between adjacent pads in one of the groups, thereby increasing the length of the net, and selectively increasing the mean spacing between the pair of nets by shifting at least one portion of at least one net of the pair away from the other net of the pair toward a position between adjacent pads in one of the groups, thereby reducing cross-talk between the nets.

DETAILED DESCRIPTION OF THE INVENTION

Figure 1:
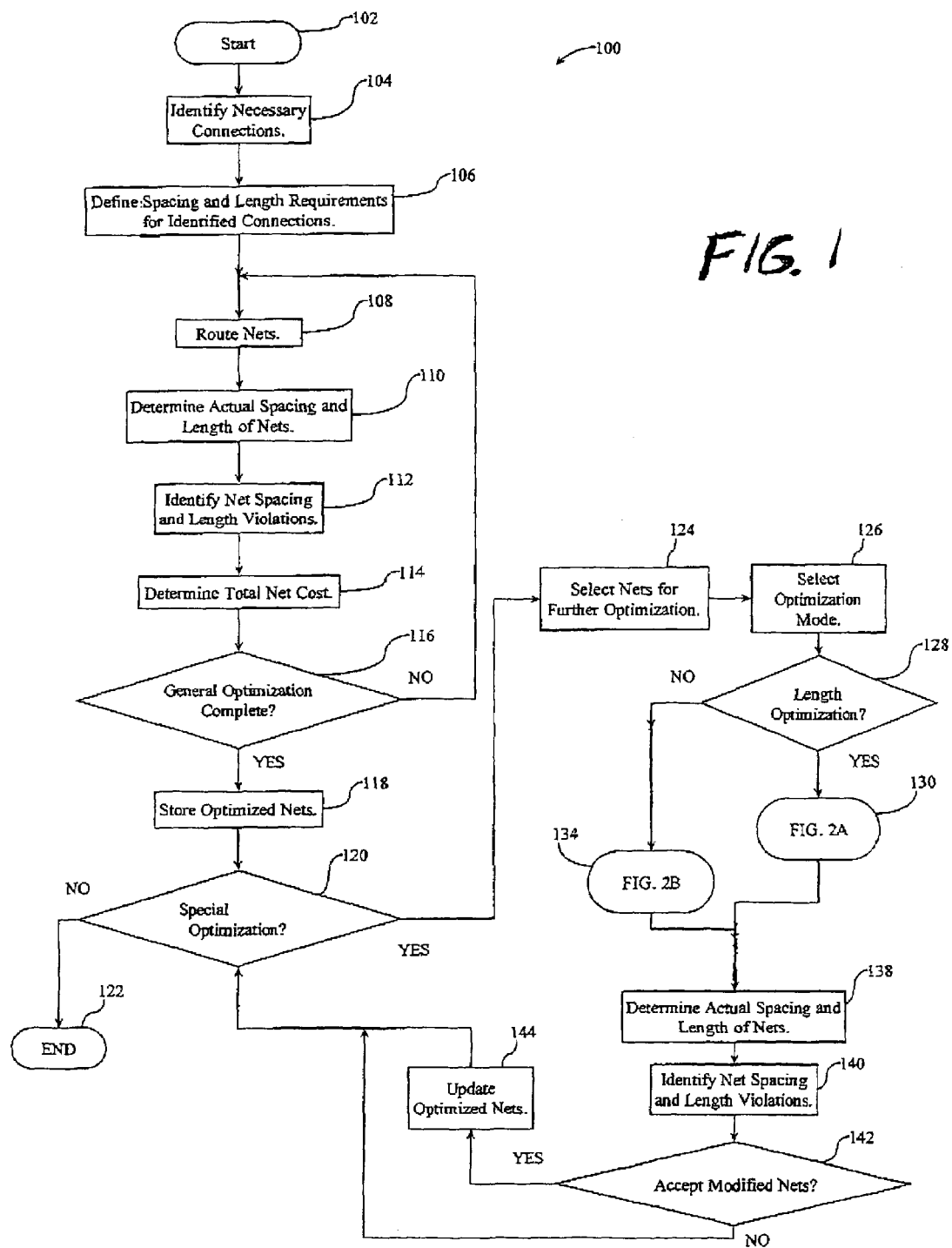
FIG. 1 is a flow chart depicting exemplary steps for specially optimizing nets in accordance with one aspect of the present invention.

Preferred features of selected embodiments of this invention will now be described with reference to the figures. It will be appreciated that the spirit and scope of the invention are not limited to the embodiments selected for illustration. Also, it should be noted that the drawings are not rendered to any particular scale or proportion. It is contemplated that any of the configurations and materials described hereafter can be modified within the scope of this invention.

Referring to the figures generally, an exemplary net routing topology and methods for forming same are provided. An exemplary method for routing nets through an obstacle field includes identifying a general path for each of a pair of nets between adjacent groups such as rows of obstacles within an obstacle field at blocks 102–118 (FIG. 1); selectively lengthening at least one of the nets by shifting at least one portion of the net toward a position between adjacent pads in one of the rows, thereby increasing the length of the net at blocks 202–220 (FIG. 2A); and selectively increasing the mean spacing between the pair of nets by shifting at least one portion of at least one net of the pair away from the other net of the pair toward a position between adjacent pads in one of the rows, thereby reducing cross-talk between the nets at blocks 224–238 (FIG. 2B). A system for performing the method and a computer program product containing computer program code that embodies the method are also provided.

An exemplary printed circuit board comprises a circuit board 300; at, least one obstacle field 304 within the circuit board 300, the at least one obstacle field 304 having a pair of adjacent rows of obstacles, e.g., obstacle rows 324 and 326; at least two nets, e.g., nets 302 and 318, along the circuit board 300, the at least two nets 302 and 318 extending between the pair of adjacent rows 324 and 326 of obstacles, wherein at least one portion 310 of one of the nets 302 is extended toward a position between adjacent obstacles 314 in one of the rows 324 and at least one portion 311 of the other of the nets 318 is extended toward a position 331 between adjacent obstacles 315 in the other of the rows 326 to increase the mean spacing between the at least two nets 302, 318.

As referred to herein, nets define signal paths between points on a circuit board, e.g., between a pin of a first component and another pin of another component. When routing nets between connection points, obstacles such as pins, pads, vias, and holes are avoided unless a connection thereto is desired. After the signal path is defined, the nets are typically used to produce electrically conductive traces on the circuit board in a manner that will be readily apparent to those of skill in the art to electrically couple components and/or connectors to one another.

Each net typically has a length requirement and a spacing requirement. The length requirement specifies length parameters for a net, e.g., a certain length +/−a threshold value, a minimum length, or a maximum length. Such length parameters may be selected to control the timing or balance the impedance of a particular net or group of nets, or for other reasons. The spacing requirement specifies spacing parameters for a net, e.g., a minimum distance between nets and a minimum distance between a net and a pad, to minimize cross talk between nets and conform to manufacturing parameters.

As referred to herein, a high-density obstacle field is an area on a printed circuit board having groups of obstacles such as regularly spaced obstacles, e.g., pads, pins, vias, or holes. In an exemplary embodiment, the high-density obstacle field is densely populated with obstacles such as pads surrounding vias within a printed circuit board for receiving a component such as an electronic component or connector, in which field the obstacles are formed in patterns such as adjacent rows of obstacles. For example, a high-density obstacle field may be associated with electronic components or connectors having several hundred or more connections. Other such densely populated obstacle fields will be readily apparent to those of skill in the art, e.g., "turning" areas for connecting nets between two other high-density obstacle fields.

Figure 5:
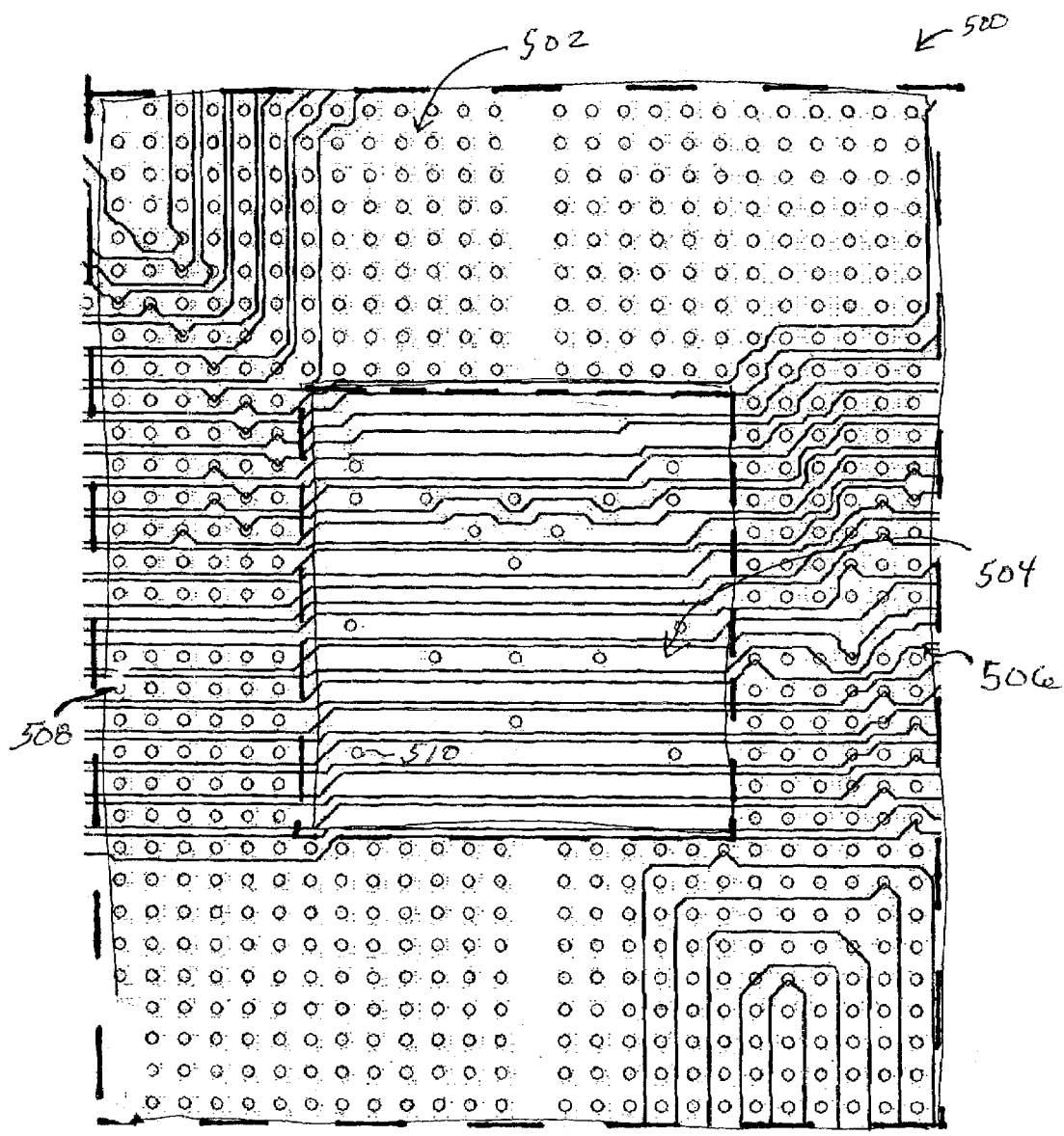
FIG. 5 is an illustration depicting the routing of nets through an obstacle field prior to special optimization.

Referring specifically to FIG. 5, a portion 500 of one layer of a printed circuit board is depicted. The illustrated portion 500 includes a high-density obstacle field 502 and a low-density obstacle field 504. A plurality of nets (represented by net 506) passes though the high-density and/or low-density obstacle fields 502, 504. The high-density obstacle field 502 includes a plurality of regularly spaced or patterned obstacles (represented by obstacle 508). The low-density obstacle field 504 includes several irregularly spaced obstacles (represented by obstacle 510). When routing nets through a high-density obstacle field 502 of regularly spaced obstacles, or areas surrounded by such obstacles (e.g., low-density field 504), the nets are preliminarily routed in generally straight lines without deviation, as illustrated in FIG. 5 (except when making connections to obstacles therein). Since the nets are routed in straight lines without deviation, the area within and surrounded by the high-density obstacle field 502 is essentially unused to obtain, needed length or to increase spacing between nets.

Since printed circuit board "real estate" is very valuable, it is desirable to fully utilize all areas on a printed circuit board. Thus, the areas within or surrounded by a high-density obstacle field, e.g., high-density obstacle field 502, represent untapped areas of the printed circuit board that are potentially very valuable.

Figures 2A, 2B:
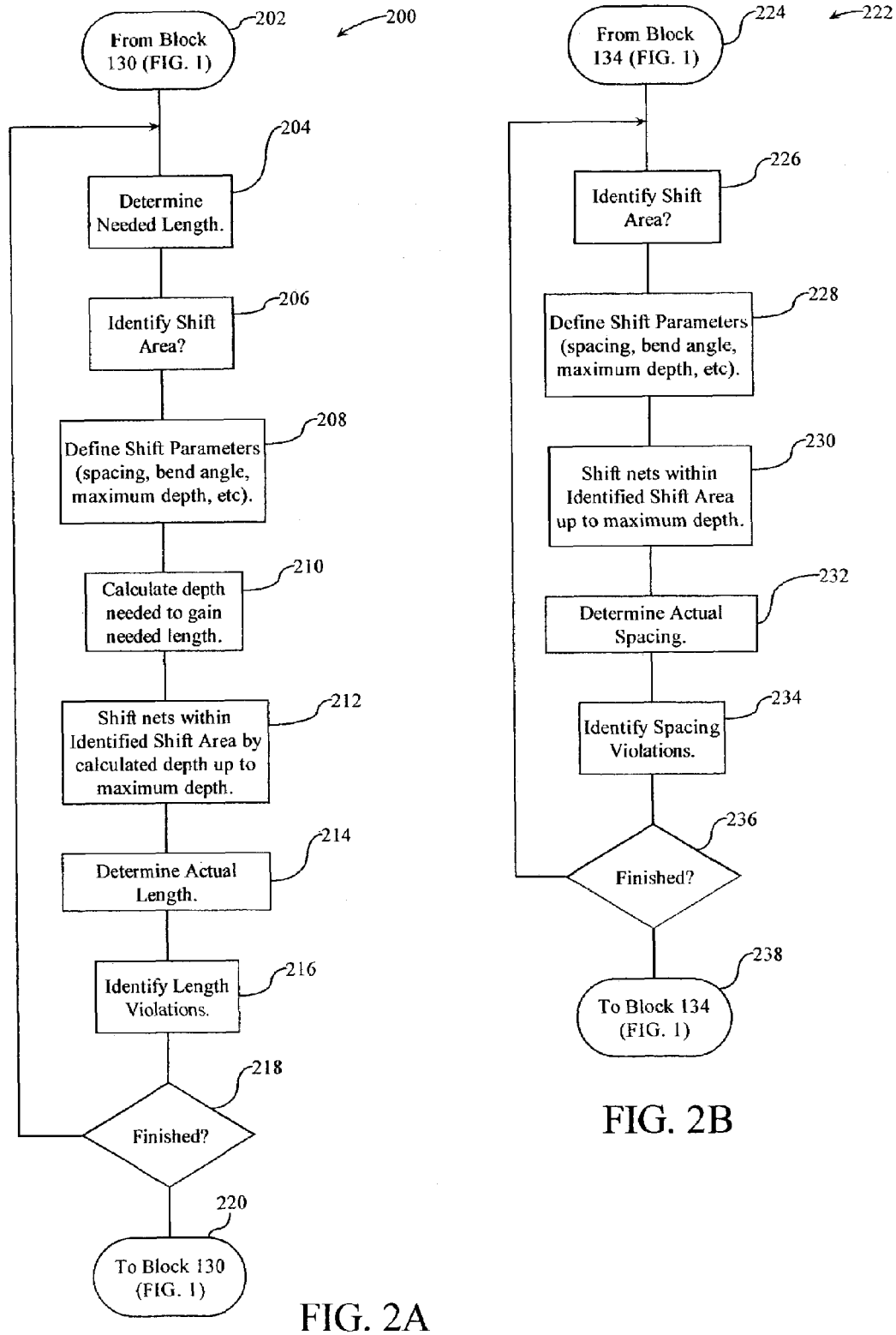
FIG. 2A is a flow chart depicting an exemplary embodiment of a method for lengthening a net in the special optimization of FIG. 1.
FIG. 2B is a flow chart depicting an exemplary embodiment of a method for spacing a net in the special optimization of FIG. 1.

FIG. 1 depicts a flow chart 100 for use in describing the routing of nets, general optimization of the nets, and special optimization of the nets in accordance with an exemplary embodiment of one aspect of the present invention. The special optimization of the nets enables increased utilization of the areas within or surrounded by high-density obstacle fields. Generally, blocks 102–118 describe the process of routing and generally optimizing the nets and blocks 120–140 describe the process of specially optimizing the nets in accordance with an exemplary embodiment of the present invention.

The method starts at block 102. In an exemplary embodiment, a routing software program running on a processor device such as described below with reference to FIG. 4 performs the steps described in block 104 through block 118. In general, for the steps described in blocks 104–118, the routing software routes a plurality of nets in an iterative manner using routing and "costing" techniques until the plurality of nets are optimized, e.g., the plurality of nets as a whole exhibit a low "cost." A lower cost is associated with lower spacing and length violations, on average, among the plurality of nets and a higher cost is associated with higher violations.

Spacing violations are proximity violations between nets or between a net and a pad. Spacing violations may result in cross-talk if a net is too close to another net. Length violations include non-conformance with a certain length characteristic such as a specified length +/−a certain distance, a minimum length, or a maximum length. Length violations may result in improper signal timing or impedance mismatch.

More specifically, at block 104, necessary connections between components are identified. For example, using routing software, a user manually positions components on a circuit board and specifies the connections between the components such as the connection of a first connection pin of a first components to a fifth connection pin of a second component. The connection between the components is typically referred to as a signal or a net, e.g., net1. At block 106, spacing and length requirements for the identified connections are defined. In certain embodiments, one or more of the parameters are stored parameters that are automatically retrieved by the routing software.

At blocks 108 through 116, the nets are routed and optimized to couple the connections identified at block 104 according to the spacing and length requirements defined at block 106. At block 108 the nets are routed. At block 110, the actual spacing and length of the nets routed at block 108 are determined. At block 112, spacing and length violations are determined based on the actual spacing and length of nets determined at block 110. In certain exemplary embodiments, routing software is configured to display the violations on a display for at least one iteration of the routing of the nets. For example, in a certain exemplary embodiment, spacing violations are identified with a colored box around the area with spacing violations and nets with length violations are displayed in a different color and/or style (e.g., solid versus broken) than nets without length violations. In alternative embodiments, violations are displayed in textual format on the display device or on a printed "hard" copy.

Various alternative methods for displaying identified spacing and length violations will be readily apparent to those of skill in the art.

At block 114, total costs associated with the plurality of routed nets for the current iteration are determined using costing techniques. At block 116, a decision is performed to determine if the general optimization is complete. The determinations may be based on the cost determined at block 114, a period of time, or other technique. For example, the general optimization may be considered complete after the cost falls below a specified level or after passage of a predefined period of time.

At block 118, the results of the general optimization are stored. In an exemplary embodiment, a processor performing the general optimizations stores the nets in a memory.

In an exemplary embodiment, the steps of blocks 102–118 result in nets being routed through at least one high-density obstacle field 502 (FIG. 5). An exemplary topology of nets routed through a high-density obstacle field after performance of the steps in blocks 102–118 is illustrated in FIG. 5.

At block 120, a decision is performed to determine whether to perform a special optimization in accordance with an exemplary embodiment of the present invention. In an exemplary embodiment, a designer affirmatively makes this decision by selecting the special optimization, e.g., by making a selection with a computer selection device from a drop-down menu displayed on a display device. In certain exemplary embodiments, net spacing and length violations as determined at block 112 are displayed to the user on a display device as described above, thereby allowing the user to select the special optimization based on this displayed information. If special optimization is not selected, processing ends at block 122.

Figure 3A:
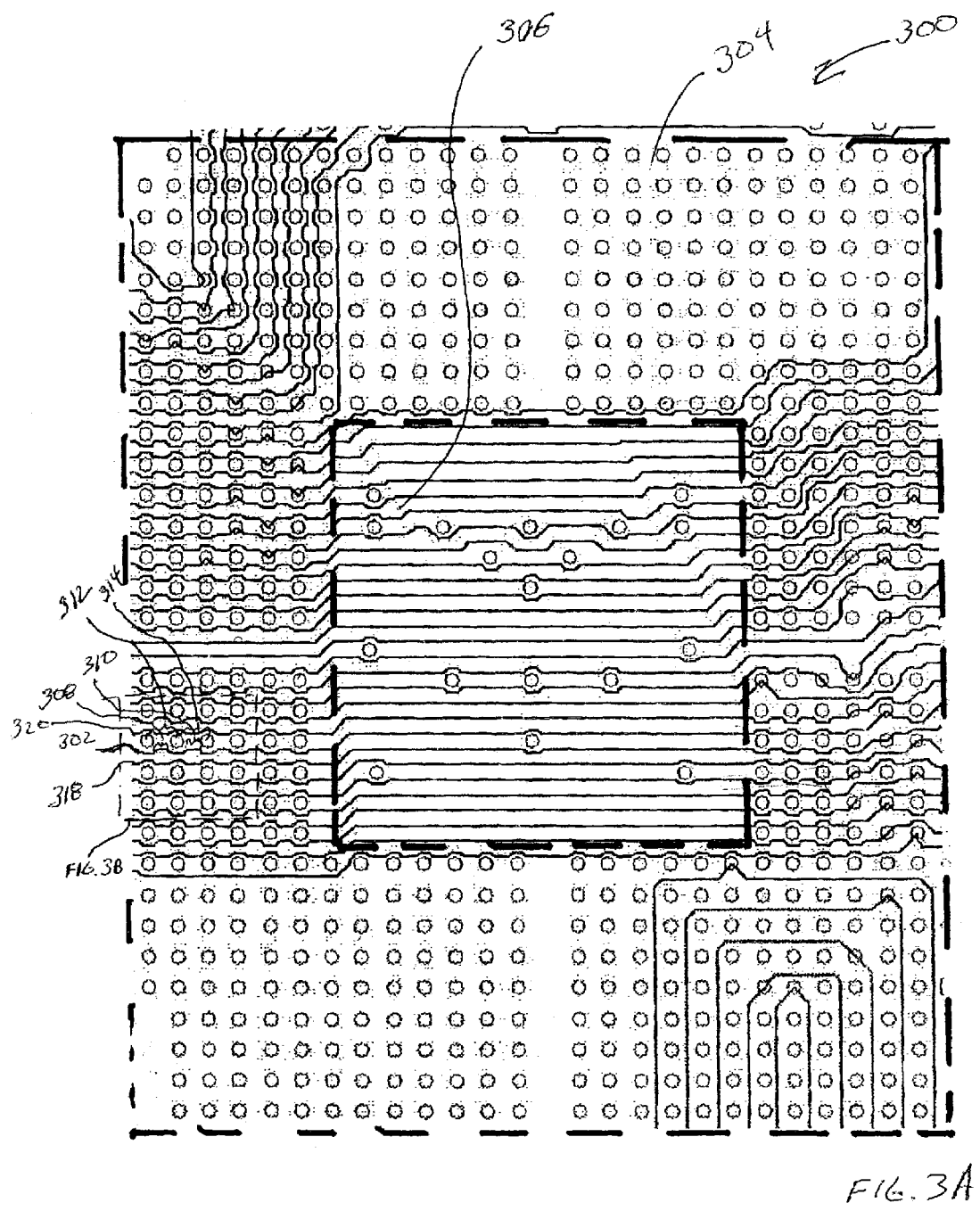
FIG. 3A is an illustration depicting an exemplary embodiment of the routing of nets through an obstacle field after special optimization in accordance with one aspect of the present invention.

In general, the steps described below with reference to block 124 to block 144 describe an exemplary embodiment for further optimizing the nets that are generally routed and generally optimized using the steps as described above with reference to blocks 104–118. The further optimization is a special optimization for optimizing nets that pass though high-density obstacle fields. Briefly, FIG. 3A depicts an exemplary embodiment of a portion 300 of a circuit board having nets that are specially optimized (e.g., net 302) in accordance with an exemplary embodiment of the present invention. The illustrated portion 300 includes a high-density obstacle field 304 and a low-density obstacle field 306 surrounded thereby.

As will be described in further detail below, a net is specially optimized by shifting portions of the net toward a position between adjacent obstacles that the net is positioned adjacent during the general optimization. For example, net 302 has been optimized through shifting such that portions of the net (represented by portions 308 and 310) are shifted to positions between pairs of obstacles (represented by a first obstacle pair 312 and a second obstacle pair 314). The resultant net 302 deviates from a general path (represented by dashed line 316), which adds length to the net 302 and positions the net farther away, on average, from an adjacent net, e.g., net 318.

Referring back to FIG. 1, more specifically, at block 124 nets are selected for further optimization. In an exemplary embodiment, a user manually selects the nets for further optimization. For example, the user may select one or more nets displayed on a display device using a user interface device. In certain exemplary embodiments, the user is able to view length and spacing violations for the nets on a circuit board oh a display device, thereby allowing the user to select only those nets that are in violation of the length and/or spacing requirements. In certain exemplary embodiments, the user is able to select all nets associated with a component. In an alternative embodiment, the nets are selected automatically. For example, all nets having spacing and/or length violations may automatically be selected for further optimizations based on the spacing and length violations identified at block 112 above.

At block 126, an optimization mode is selected. In an exemplary embodiment, a user manually selects the optimization mode. In certain exemplary embodiments, a user is able to select either length optimizations or spacing optimizations, e.g., from a drop-down menu displayed on a display device. In an alternative exemplary embodiment, the optimization mode is automatically selected. For example, the optimization may be selected based on a determination of whether spacing or length violations have a higher cost using identified length and spacing violations. Thus, either the length optimization mode or the spacing optimization mode is selected automatically depending on whether the length violations or the spacing violations have a higher cost. In certain other exemplary embodiments, the length optimization is automatically selected on a first iteration through the steps of blocks 120–144 and the space optimization is automatically selected on a second iteration, or vice versa.

At block 128 a decision is performed to determine if a length optimization mode was selected at block 128. If a length optimization was selected at block 128, processing proceeds to block 130 for length optimization of the nets selected at block 124. Otherwise, processing proceeds to block 134 for spacing optimization of the nets selected at block 124. Alternatively, processing can proceed at block 120 where a decision is performed to determine if another iteration of the special optimization is to be performed or is to end at block 122. In accordance with certain embodiments, block 120 can be configured to perform two iterations if the special optimization is selected a first time, thereby allowing the performance of one iteration with length optimization and one iteration with spacing optimization.

At block 130, processing proceeds to FIG. 2A for length optimization of the selected nets in accordance with an exemplary embodiment of one aspect of the present invention. FIG. 2A is a flow chart 200 depicting steps for performing a special optimization of the nets to achieve additional length for the selected nets in accordance with an exemplary embodiment of one aspect of the present invention. In FIG. 2A, processing begins at block 202.

At block 204, the needed length for the selected nets is determined. In an exemplary embodiment, this is performed automatically. The needed length is determined, for example, by subtracting the actual length of each net from the length requirement defined at block 106 (FIG. 1) for that net. For example, if the length requirement for a particular net is 20 inches +/−½ inches and the actual length is 19 inches, the needed length for that net would be ½ inch (i.e., 500 mils).

At block 206, an area within which to shift the nets is identified. In an exemplary embodiment, this may be performed manually. In this exemplary embodiment; a user selects areas within which to shift the nets selected for special optimizations. For example, the user may select an obstacle field through which one or more of the nets pass. Alternatively, the user may select an area of an obstacle field or a component having an associated obstacle field. In an exemplary embodiment, selection of the obstacle field is made using a user interface device. In an alternative exemplary embodiment, the selected area is selected automatically. For example, a computer program may select every obstacle field through which the net travels.

At block 208, shift parameters are defined. In an exemplary embodiment, the shift parameters include spacing between a net and an obstacle, a bend angle, and a maximum depth. In certain exemplary embodiments, one or more of the shift parameters are relative to the obstacle field through which they travel. For example, the maximum depth may be ¼ the distance between the obstacles. In certain other exemplary embodiments, one or more of the shift parameters are specified values, e.g., 12.5 mils. In certain exemplary embodiments, the shift parameters are initially set to default values that are updateable, e.g., during an initial set-up routine the first time the special optimization is invoked or through, selection from a drop-down menu.

Figure 3B:
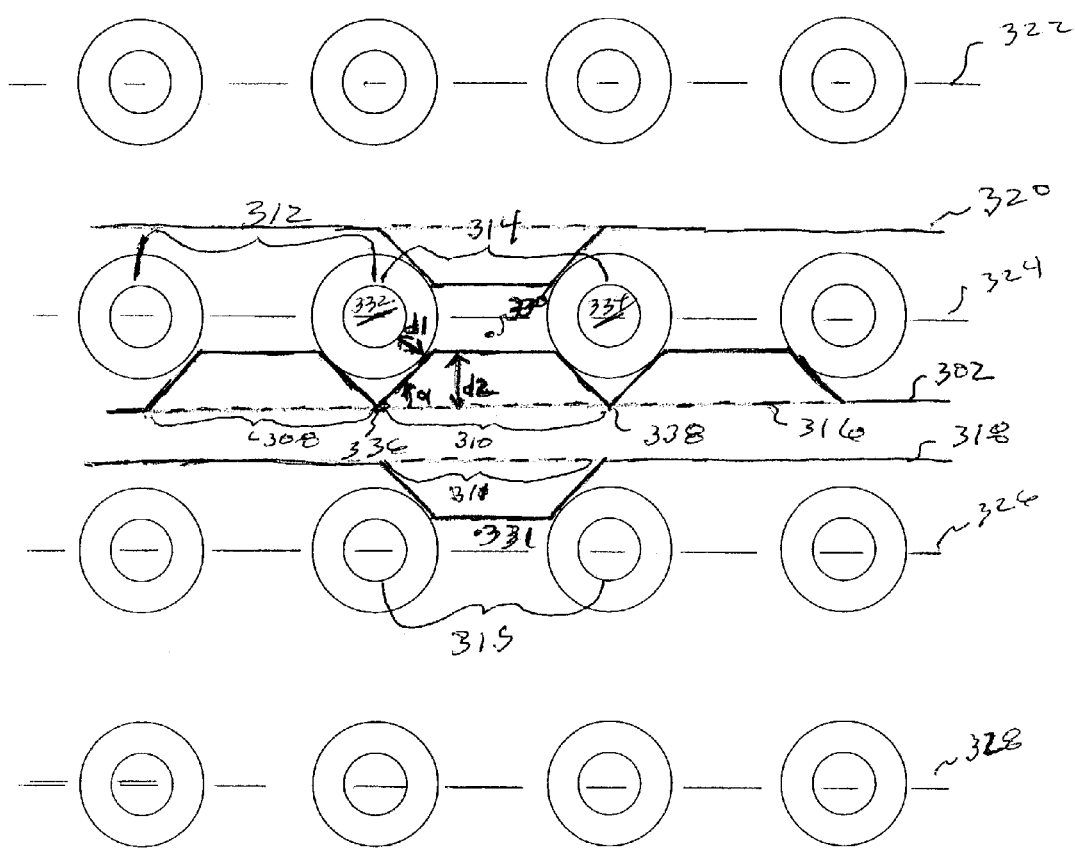
FIG. 3B is an enlarged view of a portion of an embodiment of an obstacle field in accordance with one aspect of the present invention.

FIG. 3B illustrates an enlarged portion of the high-density obstacle field 304 of FIG. 3A. The illustrated portion includes a first net 302, a second net is 318, and a third net 320 (with other nets within this enlarged portion deleted to facilitate description and avoid unnecessary clutter). In addition, the portion includes a first row of obstacles 322, a second row of obstacles 324, a third row of obstacles 326, and a fourth row of obstacles 328. The second and third rows of obstacles 324 and 326 are considered adjacent one another and a pair of the nets, i.e., net 302 and net 318, are routed therebetween. Net 302 includes a portion 310 that is shifted toward a position 330 between the adjacent obstacles of the second row of obstacles 324, i.e., between obstacle 332 and obstacle 334. In the illustrated embodiment, the shifted portion has a bend angle, $\alpha$, an obstacle distance, d1, and a reference depth, d2. In an exemplary embodiment, the bend angle, $\alpha$, and the obstacle distance, d1, are set to the defined parameters and the depth, d2, is not allowed to exceed a reference depth.

The bend angle, $\alpha$, represents an angle that a net (e.g., net 302) follows when initially shifted from a general path (e.g., path 316). In certain embodiments, the bend angle may be continuously varying up to a reference bend angle such that a curved shape is formed. For example, the net can be shifted along an arcuate path so as to follow the contours of one or more of the obstacles. Such an arcuate path can be sinusoidal, circular, elliptical, or otherwise configured. The net can also be shifted so as to follow straight lengths offset by angular turns.

The obstacle distance, d1, represents a minimum distance from an obstacle, e.g., obstacle 332, up to which the net may travel. This is typically a manufacturing parameter. The reference depth represents the distance the net can be shifted.

In one exemplary embodiment, the obstacle distance, d1, between the net and an obstacle such as a pad surrounding a via is a minimum of 5 mils, the bend angle, $\alpha$, is approximately 45 degrees, and the reference depth, d2, is ¼ the center-to-center distance between obstacles. In an obstacle field, the center-to-center distance between obstacles is approximately 50 mils. Thus, the maximum depth would be 12.5 mils in this exemplary embodiment. This allows a spacing of at least 25 mils between the centerlines of the nets if two nets were shifted into the same row of obstacles from opposite sides of the row, e.g., nets 302 and 320. It is contemplated that if no nets are present on the opposite side of a row or if the net on the opposite side of the row is not shifted, the reference depth could be greater. Assuming a bend angle of 45 degrees and a maximum depth of 12.5 mils, approximately 2*5.68 or approximately 11.4 mils are added to a net by each shift of a portion of a net toward a position between the obstacles [2*(d2/sin $\alpha$–d2)=2*(12.5/sin 45–12.5)=2*5.68=11.4 mils].

Though the foregoing dimensions and configurations help to illustrate exemplary aspects of this invention, it will be appreciated that any dimensions and configurations can be selected based on particular design constraints and parameters. In fact, it is contemplated that these dimensions are to be selected and optimized by the user.

Referring back to FIG. 2A, at block 210, the depth needed to gain the needed length is calculated. In certain exemplary embodiments, the calculated depth is determined from the shift parameters and the number of adjacent obstacles within the area identified at block 206. In certain exemplary embodiments, this takes into account shifting performed during previous special optimizations. For example, assume ½ inch, i.e., 500 mils, is needed. If there are 50 spacings between adjacent obstacles in the selected area, each spacing needs to add 10 mils. Assuming a 45 degree bend angle, the needed depth would be approximately 12.1 mils [2*(12.1/ sin 45–12.1)=2*5.01=10.0 mils added length], for example. Suitable methods for calculating the needed depth will be readily apparent to those of skill in the art of mathematics.

At block 212, the nets are shifted within the identified shift area by the depth calculated in block 210 up to the reference depth. As described above, FIG. 3B is an enlarged view of a portion of a high-density obstacle field. In the illustrated embodiment, a net 302 initially extends along a general path 316 in a first direction. The net 302 is shifted from this general path at a first position 336 along the net 302 toward the position 330 between adjacent pads. In certain embodiments, the shifted net extends at a first angle, $\alpha$, with respect to the general direction. The net 302 travels in this new direction until reaching a predefined distance from the general path. In certain exemplary embodiments, the predefined distance is the lesser of the reference depth or the calculated depth to obtain the needed length. The net 302 then extends in a direction generally parallel to the general direction. Finally, the net 302 is returned to the general path 316 at a second position 338 along the net 302.

At block 214, the actual length for the selected nets with added length due to shifting is determined and, at block 216, remaining length violations are identified.

At block 218, a decision is performed to determine if the shift steps should be repeated. If shift steps are to be repeated, processing proceeds at block 222. If the shift steps are not to be repeated, processing proceeds to block 238 and is returned to block 134 of FIG. 1. In an exemplary embodiment, a user determines if the shift steps are to be repeated. For example, the user may view the nets with length violations and if the nets pass through previously non-selected area having high-density obstacle fields, the user may decide to repeat the process to gain additional length in these areas. In an alternative embodiment, the decision is performed automatically. For example, the shift steps are not repeated if the maximum shift has been performed in every obstacle field through which a net passes. Various alternative embodiments will be readily apparent to those of skill in the art.

Referring briefly to FIG. 1, at block 134, processing proceeds to FIG. 2B for spacing optimization of the selected nets in accordance with an exemplary embodiment of one aspect of the present invention. FIG. 2B is a flow chart 222 depicting steps for performing a special optimization of the nets to achieve additional spacing for the selected nets in accordance with an exemplary embodiment of one aspect of the present invention. In FIG. 2B, processing begins at block 224.

At blocks 226 and 228, a shift area is identified and shift parameters are defined, respectively. In an exemplary embodiment, the shift area is identified and the shift parameters are defined in the same manner described above with reference to block 206 (FIG. 2A) and block 208 (FIG. 2A), respectively, and, therefore, are not described in further detail.

At block 230, nets within the shift area identified at step 222 are shifted according to the parameters defined at block 224. In an exemplary embodiment, the nets are shifted in a similar manner as described above with reference to block 212, except that the nets are always shifted to the reference depth, d2. Accordingly, the shifting of the nets is not described in further detail.

At block 232, actual spacing for the selected nets is determined and, at block 234, spacing violations are identified. At block 236, a decision is performed to determine if the shift steps should be repeated. If shift steps are to be repeated, processing proceeds at block 222. If the shift steps are not to be repeated, processing proceeds to block 238 and is returned to block 134 of FIG. 1. In an exemplary embodiment, the steps of blocks 232–236 are performed in a similar manner as the steps of blocks 214–218, respectively. Accordingly, blocks 232–236 are not described in further detail.

Referring back to FIG. 1, at block 138, the actual spacing and length of the selected nets is recalculated to reflect changes due to length and spacing optimizations performed using the steps in the flow charts of FIG. 2A and FIG. 2B, respectively. At block 140, net spacing and length violations are determined using the actual spacing and length determined at block 138. In certain embodiments, this information is displayed to a user as described above with reference to block 112.

At block 142, a decision is performed as to whether to accept the nets as modified in flow charts of FIGS. 2A and 2B. In an exemplary embodiment, the decision is performed manually by a user based on net spacing and length violations identified at block 140, which may be displayed on a display device as described above. In certain exemplary embodiments, a user accepts the modified nets if the modified nets tend to result in fewer spacing and length violations. In an alternative exemplary embodiment, the decision is performed automatically using costing techniques that will be readily apparent to those of skill in the art. If the modified nets are accepted, processing proceeds at block 140, where the optimized nets stored at block 118 are updated to include the nets as modified. Processing then proceeds back to block 120. In accordance with certain embodiments, block 120 is configured to perform two iterations if the special optimization is selected a first time, thereby allowing the performance of one iteration with length optimization and one iteration with spacing optimization.

In an exemplary use, the steps described above with reference to FIGS. 1, 2A, and 2B will now be described with reference to FIG. 3A and FIG. 5. Initially the steps associated with blocks 102–118 are performed to produce nets on a circuit board that are generally optimized. FIG. 5 depicts a high-density obstacle field 502 surrounding a low-density obstacle field 504 with exemplary nets produced in accordance with the steps associated with blocks 102–118. The nets depicted in FIG. 5 tend to travel in a generally straight direction through the obstacles within the high-density field 502 and the low-density field 504 surrounded by the high-density field 502. The nets illustrated in FIG. 5 may have a high number of spacing and length violations.

The generally optimized nets are then specially optimized to reduce the number of length and spacing violations using the steps associated with blocks 120 through 144. At block 120, a decision is performed to determine if the special optimization should be performed. At block 124 nets are selected for optimization, e.g., net 302. At blocks 126, 128, and 132, processing is performed to determine if the selected nets should be optimized for length or optimized for length on this pass though the special optimization process.

If the nets are to be optimized for length, needed length is determined at block 204 and a shift area for obtaining the needed length is identified at block 206. Once shift parameters are defined at block 208, a depth is calculated to obtain the needed length at block 210. The nets are then shifted by the needed length up to a reference depth, d2, at block 212. At block 214 actual length after shifting is determined and length violations are identified at block 216. If length optimization is not finished, processing is returned to block 204 and another shift area is identified to gain additional length.

If the nets are to be optimized for spacing, a shift area for obtaining needed spacing is identified at block 226. Once shift parameters are defined at block 228, the nets are shifted by the reference depth at block 230. At block 232, actual spacing after shifting is determined and length violations are identified at block 234. If spacing optimization is not finished, processing is returned to block 226 and another shift area is identified to gain additional length.

After the nets are optimized for length and/or spacing, at block 138, actual spacing and length of the nets are determined to identify net spacing and length violations remaining or introduced by the special optimization. At block 142, a decision is performed to determined if the modified nets should be accepted, e.g., have spacing and length violations been improved?. If the nets are accepted, the stored nets are updated to reflect the changes. FIG. 3A depicts a high-density obstacle field 304 surrounding a low-density obstacle field 306 having nets that were specially optimized. The resultant nets are used to form traces on a circuit board in a manner that will be readily apparent to those of skill in the art. FIG. 3A is an equivalent representation of traces on a circuit board.

Figure 4:
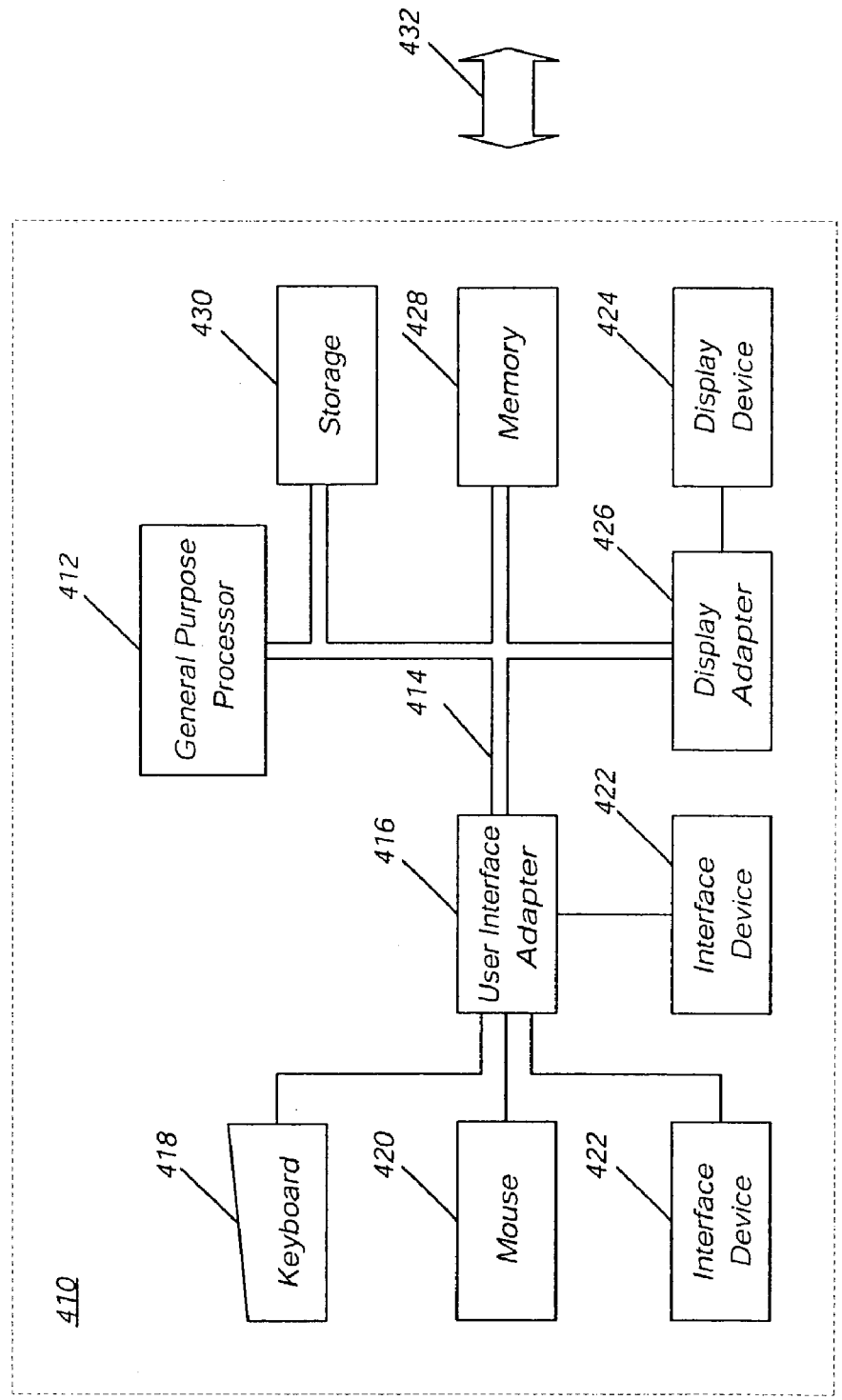
FIG. 4 is a block diagram of an exemplary embodiment of a workstation on which the steps depicted in the flow charts of FIGS. 1, 2A, and 2B can be practiced.

FIG. 4 is a block diagram of an exemplary processing device 410 in accordance with one aspect of the present invention. The processing device 410 includes a general purpose microprocessor 412 and a bus 414 employed to connect and enable communication between the microprocessor 412 and the components of the processing device 410. The processing device 410 typically includes a user interface adapter 416, which connects the microprocessor 412 via the bus 414 to one or more interface devices, such as a keyboard 418, mouse 420, and/or other interface devices 422, which can be any user interface device, such as a touch sensitive screen, digitized entry pad, etc. The bus 414 also connects a display device 424, such as an LCD screen or monitor, to the microprocessor 412 via a display adapter 426. The bus 414 also connects the microprocessor 412 to memory 428 and long-term storage 430 (collectively, "memory") which can include a hard drive, diskette drive, tape drive, etc.

The processing device 410 may communicate with other computers or networks of computers, for example, via a communications channel or modem 432. Alternatively, the processing device 410 may communicate using a wireless interface at 432. The processing device 410 may be associated with such other computers in a LAN or a wide area network (WAN), or the processing device 410 can be a client in a client/server arrangement with another computer, etc. All of these configurations, as well as the appropriate communications hardware and software, are known in the art.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method for routing nets along a printed circuit board through an obstacle field, said method comprising the steps of:
   identifying a general path for at least one net on a layer of a multi-layer circuit board between adjacent groups of obstacles within the obstacle field and identifying a path for another net on another layer of said multi-layer circuit board between adjacent groups of obstacles within the obstacle field;
   selectively lengthening at least one of said nets by shifting at least one portion of the net toward a position between adjacent pads in one of the groups, thereby increasing the length of the net; and
   selectively increasing the mean spacing between the pair of nets by shifting at least one portion of at least one net of the pair away from the other net of the pair toward a position between adjacent pads in one of the groups, thereby reducing cross-talk between the nets.

2. A method for routing nets through an obstacle field, said method comprising the steps of:
   identifying a general path for each of a pair of nets between adjacent rows of obstacles within an obstacle field; and
   selectively increasing the mean spacing between the pair of nets by shifting at least one portion of at least one net of the pair away from the other net of the pair toward a position between adjacent pads in one of the rows, thereby ring cross-talk between the nets, wherein said spacing step comprises at least the steps of:
      identifying a shift area, said shift area including said at least portion of said at least one net;
      defining a reference dept toward said position between adjacent pads; and
      shifting said at least one portion of said at least one net up to the reference depth toward said position between said adjacent pads within said shift area.

3. The method of claim 2, further comprising the steps of:
   selectively increasing the mean spacing between the pair of nets by shifting at least one portion of said other net of the pair away from said at least one net of the pair toward a position between adjacent pads in another of the rows, thereby further reducing cross-talk between the nets of the pair.

4. The method of claim 2, wherein said obstacle field is on a printed circuit board, further comprising the step of:
   selectively lengthening at least one of said nets by shifting at least one portion of the net toward a position between adjacent pads in one of the groups, thereby increasing the length of the net.

5. The method of claim 1, wherein said shifting step comprises at least the steps of:
   shifting the path of said at least one net from said general path at a fist position along said at least one net toward said position between adjacent pads;
   extending said at least one net in a direction generally parallel to said general path; and
   returning said at least one net to said general path at a second position along said at least one net.

6. The method of claim 1, wherein A method for routing nets along a printed circuit board through an obstacle field, said method comprising the steps of:
   identifying a general path for each of a pair of nets between adjacent groups of obstacles within an obstacle field;
   selectively lengthening at least one of said nets by shifting at least one portion of the net toward a position between adjacent pads in one of the groups, thereby increasing the length of the net; and
   selectively increasing the mean spacing between the pair of nets by shifting at least one portion of at least one net of the pair away from the other net of the pair toward a position between adjacent pads in one of the groups, thereby reducing cross-talk between the nets, said lengthening step comprises at least the steps of:
      identifying a shift area, said shift area including said at least one portion of said at least one net;
      defining a reference depth toward said position between adjacent pads; and
      shifting said at least one portion of said at least one net up to the reference depth toward said position between said adjacent pads within said shift area.

7. The method of claim 6, further comprising at least the steps of:
   determining a length requirement for said at least one net; and
   calculating a needed depth for shifting said at least one portion toward said position between adjacent pads within said shift area necessary to meet said length requirement for said at least one net using said adjacent pads within said shift area;
   wherein said shining step shifts said at least one portion of said at least one net toward said position between said adjacent pads within said shift area to the needed depth up to the reference depth.

8. The method of claim 6, wherein said shifting step comprises at least the steps of:
   shifting said at least one net from said general path at a first position along said net toward said position between adjacent pads;
   extending said net in a direction generally parallel to said general path; and
   returning said net to said general path at a second position along said net.

9. A method for routing nets along a printed circuit board through an obstacle field, said method comprising the steps of:
   identifying a general path for each of a pair of nets between adjacent rows of obstacles within an obstacle field; and
   selectively lengthening at least one of said nets by shifting at least one portion of the net toward a position between adjacent pads in one of the rows, thereby increasing the length of the net, wherein said lengthening step comprises at least the steps of:
      determining a length requirement for said at least one net;
      identifying a shift area, said shift area including said at least one portion of said at least one net;
      defining a reference depth toward said position between adjacent pads;
      calculating a needed depth for shifting said at least one portion toward said position between adjacent pads within said shift area necessary to meet said length requirement for said at least one net using said adjacent pads within said shift area; and
      shifting said at least one portion of said at least one net by said needed depth up to the reference depth toward said position between said adjacent pads within said shift area.

* * * * *